United States Patent
Chaung et al.

(10) Patent No.: US 9,490,624 B2
(45) Date of Patent: Nov. 8, 2016

(54) CIRCUIT FOR VOLTAGE DETECTION AND PROTECTION AND OPERATING METHOD THEREOF

(71) Applicant: MACRONIX INTERNATIONAL CO., LTD., Hsinchu (TW)

(72) Inventors: Yu-Meng Chaung, Taoyuan (TW); Chun-Hsiung Hung, Hsin Chu (TW); Kuen-Long Chang, Taipei (TW); Ken-Hui Chen, Hsin Chu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 153 days.

(21) Appl. No.: 14/472,520

(22) Filed: Aug. 29, 2014

(65) Prior Publication Data

US 2016/0064921 A1    Mar. 3, 2016

(51) Int. Cl.
*H02H 3/20* (2006.01)
*H02H 3/24* (2006.01)
*G11C 5/14* (2006.01)

(52) U.S. Cl.
CPC .............. *H02H 3/202* (2013.01); *G11C 5/143* (2013.01); *H02H 3/243* (2013.01)

(58) Field of Classification Search
CPC ........... H02H 3/02; H02H 3/243; G11C 5/14

USPC ............................................................ 361/90
See application file for complete search history.

(56) References Cited

U.S. PATENT DOCUMENTS

| | | | | |
|---|---|---|---|---|
| 5,224,010 A * | 6/1993 | Tran | ........................ | G06F 1/28 361/90 |
| 6,333,650 B1 * | 12/2001 | Amin | ....................... | G06F 1/26 327/143 |
| 6,691,239 B1 * | 2/2004 | Rose | ........................ | G06F 1/26 713/330 |
| 2009/0200875 A1 * | 8/2009 | Higuchi | ................ | G06F 17/505 307/125 |

* cited by examiner

*Primary Examiner* — Scott Bauer
(74) *Attorney, Agent, or Firm* — McClure, Qualey & Rodack, LLP

(57) ABSTRACT

A circuit for voltage detection and protection comprises a first block, a first voltage detector, a second block and a second voltage detector. The first block receives a first voltage supply. The first voltage detector detects the first voltage supply and generates a first detecting signal when detecting the first voltage supply level is out of the first operating voltage range. The second block receives a second voltage supply. The second voltage detector detects the second voltage supply and generates a second detecting signal when detecting the second voltage supply level is out of the second operating voltage range. The first block performs a protection operation on the circuit when monitoring at least one of the first and second detecting signals.

18 Claims, 2 Drawing Sheets

CIRCUIT FOR VOLTAGE DETECTION AND PROTECTION AND OPERATING METHOD THEREOF

TECHNICAL FIELD

The disclosure relates in general to a circuit and an operating method thereof, and more particularly to a circuit for voltage detection and protection and an operating method thereof.

BACKGROUND

In a system, circuit blocks may be operated under different voltage supply levels. For example, the Micro Control Unit (MCU) voltage supply level could be 1.2V, the Dynamic Random Access Memory (DRAM) voltage supply level could be 1.5V, and the NOR flash voltage supply level could be 3V. However, the operation of a circuit block is not guaranteed when the supplied voltage supply is lower than expectation. For example, a system error could occur when one circuit block is still delivering/accessing data to another block supplied by a voltage supply lower than expectation.

SUMMARY

The disclosure is directed to a circuit for voltage detection and protection and an operating method thereof. The circuit of the present invention detects each voltage supply from the power source and performs protection operation when it is found that the voltage supply level is abnormal, so that system errors or incorrect operation result can be avoided.

According to one embodiment, a circuit for voltage detection and protection is provided. The circuit comprises a first block, a first voltage detector, a second block and a second voltage detector. The first block is used for receiving a first voltage supply, wherein the first block has a first operating voltage range. The first voltage detector is used for detecting the first voltage supply and generating a first detecting signal when detecting the voltage level of the first voltage supply is out of the first operating voltage range. The second block is used for receiving a second voltage supply, wherein the second block has a second operating voltage range. The second voltage detector is used for detecting the second voltage supply and generating a second detecting signal when detecting the voltage level of the second voltage supply is out of the second operating voltage range. The first block performs a protection operation on the circuit in response to at least one of the first and second detecting signals.

According to another embodiment, a circuit for voltage detection and protection is provided. The circuit comprises a first block, a first voltage detector, a second block and a second voltage detector. The first block is used for receiving a voltage supply, wherein the first block has a first operating voltage range. The first voltage detector is used for detecting the voltage supply and generating a first detecting signal when detecting the voltage level of the voltage supply is out of the first operating voltage range. The second block is used for receiving the voltage supply, wherein the second block has a second operating voltage range. The second voltage detector is used for detecting the voltage level of the voltage supply and generating a second detecting signal when detecting the voltage level of the voltage supply is out of the second operating voltage range. The first block performs a protection operation on the circuit in response to at least one of the first and second detecting signals.

According to an alternative embodiment, an operating method of a circuit for voltage detection and protection is provided. The circuit comprises a first block, a first voltage detector, a second block and a second voltage detector. The operation method comprises the following steps: receiving a first voltage supply by the first block, having a first operating voltage range; detecting, by the first voltage detector, the voltage level of the first voltage supply and generating a first detecting signal when detecting the voltage level of the first voltage supply is out of the first operating voltage range; receiving a second voltage supply by the second block having a second operating voltage range; detecting, by the second voltage detector, the voltage level of the second voltage supply and generating a second detecting signal when the voltage level of the second voltage supply is out of the second operating voltage range; and performing a protection operation on the circuit in response to at least one of the first and second detecting signals.

Figure 1:
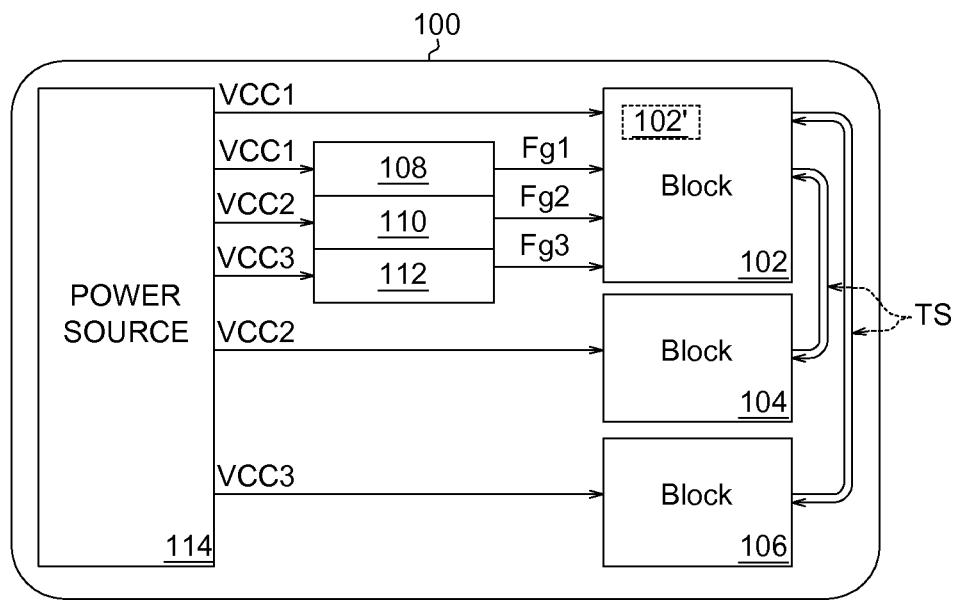
FIG. 1 shows a block diagram of a circuit according to an embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 shows a block diagram of a circuit 100 according to an embodiment of the present invention. The circuit 100 comprises a plurality of blocks 102, 104, 106, a plurality of voltage detectors 108, 110, 112 and optionally comprises a power source 114. The circuit 100 can be a system implemented by multi chip package (MCP) or a combination of multi-chips on board. The blocks 102, 104 and 106 are different parts of the circuit 100 such as a flash memory, a Micro Control Unit (MCU), a Dynamic Random Access Memory (DRAM) or a circuit module performing specific functions. These blocks 102, 104 and 106 can use taking signals TS to communicate with each other. For better illustration, the block 102 is used as a controller for controlling the operations of the circuit 100.

The voltage detectors 108, 110 and 112 can be, for example, comparators or logics capable of comparing a voltage level with a threshold value. Each voltage detector 108, 110, 112 may has its own voltage detection range for different levels of voltage supply.

In the example of FIG. 1, the voltage detectors 108, 110 and 112 are stand-alone components away from the blocks 102, 104 and 106. It is understood that the circuit structure shown in FIG. 1 is just one way of implementing the present invention. The number or configurations of blocks and voltage detectors are given for illustration purposes, not for restriction purposes, as the present invention may be implemented in many different ways in accordance with the principles of the present invention.

In the example of FIG. 1, the voltage supplies VCC1-VCC3 are delivered by the power source 114, while in another example, the voltage supplies VCC1-VCC3 can be provided by an external power source. The voltage levels of the voltage supplies VCC1-VCC3 may be different because each block 102, 104, 106 may has its own suitable operating voltage range. The operating voltage range of a block can be defined in spec or predetermined to guarantee the operation of the block. Generally, a block can operate normally when the voltage level of the received voltage supply is within its operating voltage range. If the voltage level of the received voltage supply is out of the operating voltage range (i.e., not within the operating voltage range), the operation of a block is not guaranteed. For example, if a flash memory (block) is supplied by a voltage supply less than 1.2V (an exemplary lower end of the operating voltage range of the flash memory), the writing error of the flash memory may significantly increased.

The voltage detectors 108, 110 and 112 are configured to detect the voltage levels of the voltage supplies VCC1-VCC3, respectively. If it is detected that the voltage level of the voltage supply VCC1 is out of the operating voltage range of the block 102, the voltage detector 108 may generate a corresponding detecting signal. For example, the voltage detector 108 may set up a flag Fg1 to signify an abnormal status of the block 102 when detecting that the voltage level of the voltage supply VCC1 is out of the operating voltage range of the block 102. Similarly, if it is detected that the voltage level of the voltage supply VCC2 is out of the operating voltage range of the block 104, the voltage detector 110 may generate a corresponding detecting signal, e.g., a flag Fg2, to signify an abnormal status of the block 104. And, if it is detected that the voltage level of the voltage supply VCC3 is out of the operating voltage range of the block 106, the voltage detector 112 may generate a corresponding detecting signal, e.g., a flag Fg3, to signify an abnormal status of the block 106.

In the example of FIG. 1, the block 102 (controller) can perform a protection operation on the circuit 100 to cope with the abnormal status of the blocks 102, 104 and 106 in response to at least one of the detecting signals, e.g., flags Fg1-Fg3. For example, the block 102 may perform a protection operation to stop the circuit 100 partially or wholly when monitoring at least one of the flags Fg1-Fg3. Or, the block 102 may perform a protection operation to suspend the activities of those blocks operated under an abnormal voltage supply level (ex., lower or higher than the operating voltage range of the block) to avoid incorrect operation results. For example, the block 102 may suspend its own activities when monitoring the flag Fg1, may suspend activities of the block 104 when monitoring the flag Fg2, and may suspend activities of the block 106 when monitoring the flag Fg3. The block 102 will recover the activities of those suspended blocks after the corresponding flags are reset (i.e., the abnormal voltage supply level recovers to a normal state).

In the embodiment, the block 102 may further comprise a sub-control logic 102' having an operating voltage range lower than the operating voltage range of the block 102. That is, the sub-control logic 102' can be suitably operated under a voltage level lower than the operating voltage range of the block 102. When the voltage level of the voltage supply VCC 1 is out of the operating voltage range of the block 102 but within the operating voltage range of the sub-control logic 102', the sub-control logic 102' performs the protection operation on the circuit 100. Therefore, even if the block 102 receives abnormal low voltage supply VCC1, the protection operation of the circuit 100 still can be performed to avoid system error.

Figure 2:
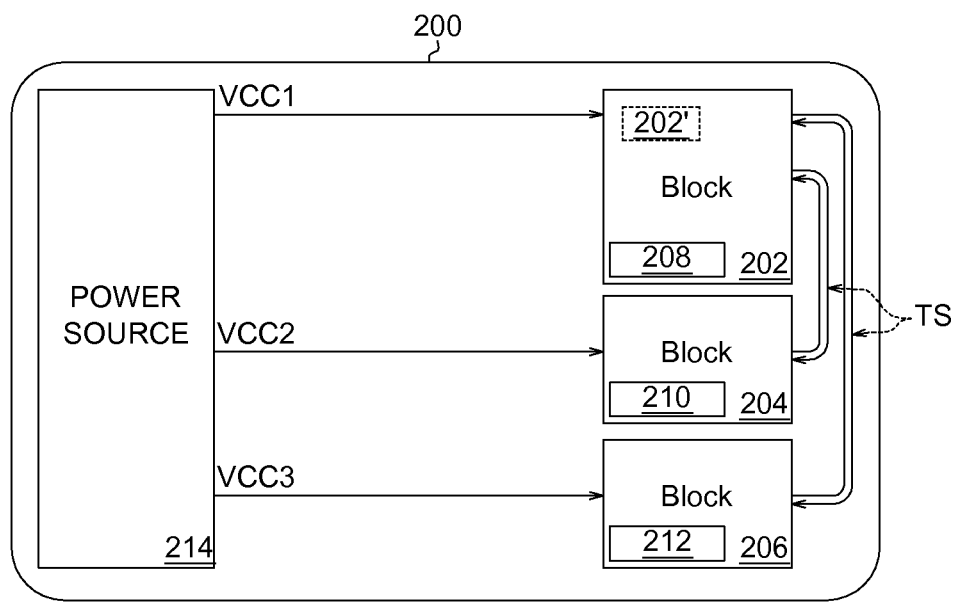
FIG. 2 shows a block diagram of a circuit according to another embodiment of the present invention.

FIG. 2 shows a block diagram of a circuit 200 according to another embodiment of the present invention. The circuit 200 comprises a plurality of blocks 202, 204, 206, a plurality of detectors 208, 210, 212, and optionally comprises a power source 214. The main difference from the previous embodiment relies in that the voltage detectors 208, 210 and 212 are embedded in the blocks 202, 204 and 206, respectively.

In the example of FIG. 2, the block 202 is used as a controller of the circuit 200. The block 202 copes with all abnormal voltage supply issues of the circuit 200. For example, when the voltage level of the voltage supply VCC1 is out of the operating voltage range of the block 202, the voltage detector 208 may set up a flag to signify the block 202 that the voltage supply VCC1 is abnormal. When the voltage level of the voltage supply VCC2 is out of the operating voltage range of the block 204, the voltage detector 210 may set up a flag to signify the block 202 an abnormal status of the block 204 through the talking signal TS. When the voltage level of the voltage supply VCC3 is out of the operating voltage range of the block 206, the voltage detector 210 may set up a flag to signify the block 202 an abnormal status of the block 206 through the talking signal TS.

Similar to the previous embodiment, the block 202 performs a protection operation on the circuit 200 to cope with the abnormal status of the blocks 202, 204 and 206 when monitoring at least one flag. The block 202 may stop the circuit 200 partially or wholly when monitoring at least one flag, or may suspend the activities of those blocks operated under an abnormal voltage supply level. The block 202 will recover the activities of those suspended blocks after the corresponding flags are reset.

The block 202 may further comprise a sub-control logic 202' having an operating voltage range lower than the operating voltage range of the block 202. If the voltage detector 208 finds that the voltage level of the voltage supply VCC 1 is out of the operating voltage range of the block 202 but within the operating voltage range of the sub-control logic 202', the sub-control logic 302' will perform the protection operation to prevent system error. Therefore, even if the block 202 receives abnormal low voltage supply VCC1, the protection operation of the circuit 200 still can be performed.

Figure 3:
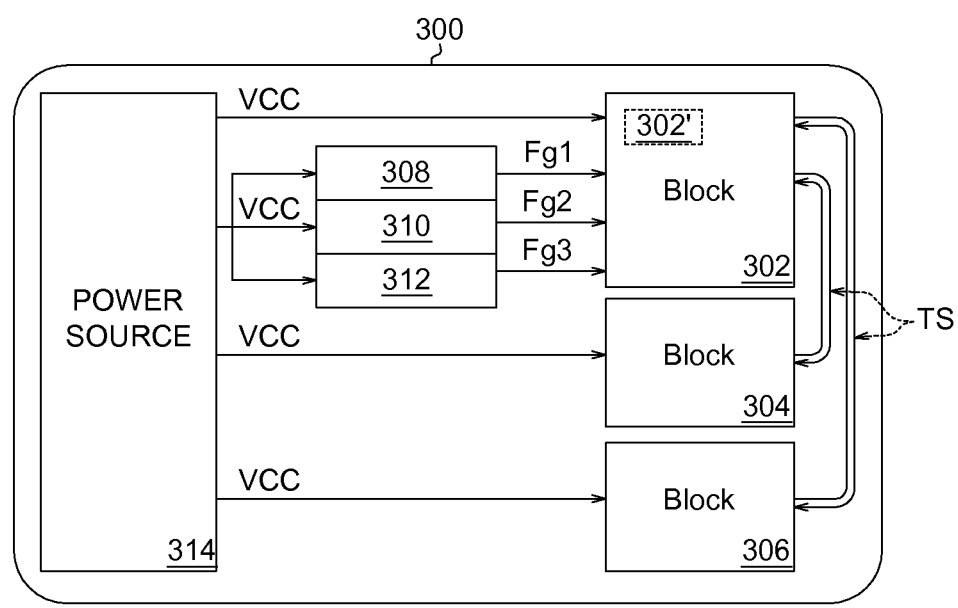
FIG. 3 shows a block diagram of a circuit according to yet another embodiment of the present invention.

FIG. 3 shows a block diagram of a circuit 300 according to yet another embodiment of the present invention. The circuit 300 comprises a plurality of blocks 302, 304, 306, a plurality of detectors 308, 310, 312, and optionally comprises a power source 314. The voltage detectors 308, 310 and 312 can be stand-alone components away from the blocks 302, 304 and 306 or respectively embedded in the blocks 302, 304 and 306 like the circuit configuration shown in FIG. 2. The main difference from the previous embodiments relies in that the blocks 302, 304 and 306 are supplied by the same voltage supply VCC.

In the example of FIG. 3, the blocks 302, 304, 306 may have different tolerances for abnormal voltage supply. For example, if the block 306 has a tolerance of 5% voltage supply drop, the block 306 can operate normally when the voltage supply VCC is lower than the expectation of 3% (<5%) and may operate abnormally when the voltage supply VCC is lower than the expectation of 10%(>5%)

Each voltage detector 308, 310, 312 can detect whether the level of the voltage supply VCC is out of the operating voltage range of the corresponding block (beyond the tolerances for abnormal voltage supply). The voltage detectors 308, 310 and 312 may have respective voltage detection ranges for the corresponding operating voltage ranges of the blocks 302, 304 and 306. When it is detected that the voltage level of the voltage supply VCC1 is out of the operating voltage range of the block 302, the voltage detector 308 may set up a flag Fg1 to signify an abnormal status of the block 302. Similarly, when it is detected that the voltage level of the voltage supply VCC2 is out of the operating voltage range of the block 304, the voltage detector 310 may set up a flag Fg2 to signify an abnormal status of the block 304. And, when it is detected that the voltage level of the voltage supply VCC3 is out of the operating voltage range of the block 306, the voltage detector 312 may set up a flag Fg3 to signify an abnormal status of the block 306.

When the block 302 (controller) monitors at least one of the flags Fg1-Fg3, the block 302 performs a protection operation on the circuit 300 to cope with the abnormal voltage supply status. For example, the block 302 may stop the circuit 300 partially or wholly when monitoring at least one of the flags Fg1-Fg3, or may suspend the activities of those blocks operated under an abnormal voltage supply level. The block 302 will recover the activities of those suspended blocks after the corresponding flags are reset.

The block 302 may further comprise a sub-control logic 302' having an operating voltage range lower than the operating voltage range of the block 302. When the voltage detector 308 detects that the voltage level of the voltage supply VCC 1 is out of the operating voltage range of the block 302 but within the operating voltage range of the sub-control logic 302', the sub-control logic 302' may perform the abovementioned protection operation to protect the circuit 300. Therefore, even if the block 302 receives abnormal low voltage supply VCC1, the protection operation of the circuit 300 still can be performed.

According to the above, the circuit for voltage detection and protection of the present invention detects each voltage supply from the power source and performs protection operation when it is found that the voltage supply level is abnormal. Therefore, system errors or incorrect operation result can be avoided.

An operating method of a circuit for voltage detection and protection is further provided according to the embodiments of the present invention. The circuit comprises a first block, a first voltage detector, a second block and a second voltage detector. The operation method comprises the following steps: receiving a first voltage supply by the first block, having a first operating voltage range; detecting, by the first voltage detector, the voltage level of the first voltage supply and setting up a first flag when the voltage level of the first voltage supply is out of the first operating voltage range; receiving a second voltage supply by the second block having a second operating voltage range; detecting, by the second voltage detector, the voltage level of the second voltage supply and setting up a second flag when the voltage level of the second voltage supply is out of the second operating voltage rang; and performing a protection operation on the circuit when the first block monitors at least one of the first and second flags.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A circuit for voltage detection and protection, comprising:
 a first block for receiving a first voltage supply, wherein the first block has a first operating voltage range;
 a first voltage detector for detecting the first voltage supply and generating a first detecting signal when detecting the voltage level of the first voltage supply is out of the first operating voltage range;
 a second block for receiving a second voltage supply, wherein the second block has a second operating voltage range; and
 a second voltage detector for detecting the second voltage supply and generating a second detecting signal when detecting the voltage level of the second voltage supply is out of the second operating voltage range;
 wherein the first block performs a protection operation on the circuit in response to at least one of the first and second detecting signals;
 wherein the first block comprises:
 a sub-control block having a third operating voltage range lower than the first operating voltage range;
 wherein the sub-control block performs the protection operation on the circuit when the voltage level of the first voltage supply is out of the first operating voltage range but within the third operating voltage range.

2. The circuit according to claim 1, wherein the first block performs the protection operation to stop the circuit partially or wholly when monitoring at least one of the first and second detecting signals.

3. The circuit according to claim 1, wherein the first block performs the protection operation to suspend activities of the first block when monitoring the first detecting signal and to suspend activities of the second block when monitoring the second detecting signal.

4. The circuit according to claim 3, wherein the first block recovers the activities of the first and second blocks after the first and second detecting signals are reset.

5. The circuit according to claim 1, wherein the first and second voltage detectors are stand-alone components away from the first and second blocks.

6. The circuit according to claim 1, wherein the first and second voltage detectors are embedded in the first and second blocks, respectively.

7. The circuit according to claim 1, further comprising:
 a power source for providing the first voltage supply and the second voltage supply to the first block and second block, respectively.

8. The circuit according to claim 7, wherein the voltage level of the first voltage supply is different from the voltage level of the second voltage supply.

9. A circuit for voltage detection and protection, comprising:
 a first block for receiving a voltage supply, wherein the first block has a first operating voltage range;
 a first voltage detector for detecting the voltage supply and generating a first detecting signal when detecting the voltage level of the voltage supply is out of the first operating voltage range;
 a second block for receiving the voltage supply, wherein the second block has a second operating voltage range; and a second voltage detector for detecting the voltage level of the voltage supply and generating a second detecting signal when detecting the voltage level of the voltage supply is out of the second operating voltage range;

wherein the first block performs a protection operation on the circuit in response to at least one of the first and second detecting signals;

wherein the first block comprises:

a sub-control block having a third operating voltage range lower than the first operating voltage range;

wherein the sub-control block performs the protection operation on the circuit when the voltage level of the first voltage supply is out of the first operating voltage range but within the third operating voltage range.

10. The circuit according to claim 9, wherein the first block performs the protection operation to stop the circuit partially or wholly when monitoring at least one of the first and second detecting signals.

11. The circuit according to claim 9, wherein the first block performs the protection operation to suspend activities of the first block when monitoring the first detecting signal and to suspend activities of the second block when monitoring the second detecting signal.

12. The circuit according to claim 11, wherein the first block recovers the activities of the first and second blocks after the first and second detecting signals are reset.

13. The circuit according to claim 9, wherein the first and second voltage detectors are stand-alone components away from the first and second blocks.

14. The circuit according to claim 9, wherein the first and second voltage detectors are embedded in the first and second blocks, respectively.

15. The circuit according to claim 9, further comprising:
a power source for providing the voltage supply to the first and second blocks.

16. An operating method of a circuit for voltage detection and protection, wherein the circuit comprises a first block, a first voltage detector, a second block and a second voltage detector, the operation method comprising:

receiving a first voltage supply by the first block, wherein the first block has a first operating voltage range;

detecting, by the first voltage detector, the voltage level of the first voltage supply and generating a first detecting signal when detecting the voltage level of the first voltage supply is out of the first operating voltage range;

receiving a second voltage supply by the second block, wherein the second block has a second operating voltage range;

detecting, by the second voltage detector, the voltage level of the second voltage supply and generating a second detecting signal when the voltage level of the second voltage supply is out of the second operating voltage range; and performing, by the first block, a protection operation on the circuit in response to at least one of the first and second detecting signals;

wherein the first block comprises:

a sub-control block having a third operating voltage range lower than the first operating voltage range;

wherein the sub-control block performs the protection operation on the circuit when the voltage level of the first voltage supply is out of the first operating voltage range but within the third operating voltage range.

17. The operating method according to claim 16, wherein the step of performing a protection operation further comprising:

stopping the circuit partially or wholly when the first block monitors at least one of the first and second detecting signals.

18. The operating method according to claim 16, wherein the step of performing the protection operation further comprising:

suspending activities of the first block when the first block monitors the first detecting signal; and suspending activities of the second block when the first block monitors the second detecting signal.

* * * * *